United States Patent
Gruber et al.

(10) Patent No.: US 11,264,975 B2
(45) Date of Patent: Mar. 1, 2022

(54) SIGNAL GENERATOR

(71) Applicant: Carl Zeiss Industrielle Messtechnik GmbH, Oberkochen (DE)

(72) Inventors: Udo Gruber, Langenaltheim (DE); Thomas Maier, Aalen (DE)

(73) Assignee: Carl Zeiss Industrielle Messtechnik GmbH, Oberkochen (DE)

( * ) Notice: Subject to any disclaimer, the term of this patent is extended or adjusted under 35 U.S.C. 154(b) by 0 days.

(21) Appl. No.: 17/085,516

(22) Filed: Oct. 30, 2020

(65) Prior Publication Data

US 2021/0143806 A1 May 13, 2021

(30) Foreign Application Priority Data

Oct. 30, 2019 (EP) ..................................... 19206267

(51) Int. Cl.
| | | |
|---|---|---|
| *H03K 4/00* | (2006.01) | |
| *H03K 4/06* | (2006.01) | |
| *H03K 4/92* | (2006.01) | |
| *H03L 7/18* | (2006.01) | |
| *H03K 4/08* | (2006.01) | |

(52) U.S. Cl.
CPC ................. *H03K 4/06* (2013.01); *H03K 4/08* (2013.01); *H03K 4/92* (2013.01); *H03L 7/18* (2013.01)

(58) Field of Classification Search
None
See application file for complete search history.

(56) References Cited

U.S. PATENT DOCUMENTS

| | | | | | |
|---|---|---|---|---|---|
| 3,838,414 | A | * | 9/1974 | Wiles | ...................... G06F 1/022 341/147 |
| 4,748,640 | A | * | 5/1988 | Staley | ....................... G06F 7/62 327/107 |
| 9,813,068 | B2 | * | 11/2017 | Iwasaki | ..................... H03K 4/06 |
| 2011/0006817 | A1 | * | 1/2011 | Han | .......................... G06F 1/08 327/134 |
| 2018/0234062 | A1 | * | 8/2018 | Ramorini | ............... H03K 4/066 |

FOREIGN PATENT DOCUMENTS

| | | | |
|---|---|---|---|
| CN | 112564459 | * | 3/2021 |
| DE | 3613505 | C1 | 5/1987 |
| DE | 19906559 | C1 | 4/2000 |

OTHER PUBLICATIONS

Wikipedia; Bhaskara I's sine approximation formula; Sep. 27, 2019; XP055690728; URL: https://en.wikipedia.org/w/index.php?title=Bhaskara_I's_sine_approximation_formula&oldid=918152432; 6 pages.

* cited by examiner

*Primary Examiner* — Tuan T Lam
(74) *Attorney, Agent, or Firm* — Miller Johnson

(57) ABSTRACT

A signal generator includes a processing unit. The signal generator is configured to generate at least one periodic output signal. The output signal comprises a triangular-waveform signal. A frequency and an amplitude of the output signal are adjustable. The signal generator is configured to receive an input parameter. The input parameter comprises at least one piece of information about a setpoint amplitude and a setpoint frequency of the output signal. The processing unit is configured to determine a signal direction of the output signal. The processing unit is configured to determine a step size. The processing unit is configured to apply the step size to an actual amplitude based on the signal direction for a number of clock cycles. The number of clock cycles is dependent on the setpoint frequency of the output signal.

19 Claims, 3 Drawing Sheets

SIGNAL GENERATOR

CROSS-REFERENCE TO RELATED APPLICATIONS

This application claims priority to European Application No. 19 206 267.7 filed Oct. 30, 2019. The entire disclosure of the application referenced above is incorporated by reference.

FIELD

The invention relates to a signal generator, a system for generating at least one output signal and a method for generating at least one periodic output signal. The present invention relates in particular to the field of integrated circuits.

BACKGROUND

Methods and apparatuses for generating a periodic output signal are known fundamentally from the prior art. For example microcontrollers or integrated circuits can be used.

Periodic output signals can be generated using a firmly set amplitude and frequency of the output signal. Furthermore, function generators are known in which changes of amplitude and/or frequency are possible. Such generators require a high level of computing power and many resources, however. Previously known function generators were implementable in an FPGA only with great difficulty, since calculation of the signals is very complex and resource-intensive.

SUMMARY

It is therefore an object of the present invention to provide a signal generator, a system for generating at least one output signal and a method for generating at least one periodic output signal that at least largely avoid the disadvantages of known apparatuses and methods. The aim is in particular to allow amplitude and frequency to be set in a resource-saving manner.

This object is achieved by apparatuses and a method having the features of the independent patent claims. Advantageous developments, which can be realized individually or in combination, are presented in the dependent claims.

Hereinafter the terms "exhibit", "have", "comprise" or "include" or any grammatical deviations therefrom are used in a non-exclusive way. Accordingly, these terms can refer either to situations in which, besides the feature introduced by these terms, no further features are present, or to situations in which one or more further features are present. For example, the expression "A exhibits B", "A has B", "A comprises B" or "A includes B" can refer both to the situation in which no further element aside from B is provided in A (that is to say to a situation in which A consists exclusively of B) and to the situation in which, in addition to B, one or more further elements are provided in A, for example element C, elements C and D, or even further elements.

Furthermore, it is pointed out that the terms "at least one" and "one or more" and grammatical modifications of these terms or similar terms, if they are used in association with one or more elements or features and are intended to express the fact that the element or feature can be provided singly or multiply, in general are used only once, for example when the feature or element is introduced for the first time. When the feature or element is subsequently mentioned again, the corresponding term "at least one" or "one or more" is generally no longer used, without restriction of the possibility that the feature or element can be provided singly or multiply.

Furthermore, hereinafter the terms "preferably", "in particular", "by way of example" or similar terms are used in conjunction with optional features, without alternative embodiments thereby being restricted. In this regard, features introduced by these terms are optional features, and there is no intention to restrict the scope of protection of the claims, and in particular of the independent claims, by these features. In this regard, the invention, as will be recognized by a person skilled in the art, can also be carried out using other configurations. Similarly, features introduced by "in one embodiment of the invention" or by "in one example embodiment of the invention" are understood as optional features, without alternative configurations or the scope of protection of the independent claims thereby being intended to be restricted. Furthermore, all possibilities of combining the features introduced by these introductory expressions with other features, whether optional or non-optional features, are intended to remain unaffected by the introductory expressions.

In a first aspect of the present invention, a signal generator is proposed. The term "signal generator" as used here is a broad term which is intended to be accorded its customary and familiar meaning as understood by a person skilled in the art. The term is not restricted to a specific or adapted meaning. The term can refer, without restriction, in particular to an apparatus for generating a fundamentally arbitrary output signal. The term "output signal" as used here is a broad term which is intended to be accorded its customary and familiar meaning as understood by a person skilled in the art. The term is not restricted to a specific or adapted meaning. The term can refer, without restriction, in particular to a voltage. The output signal can have a frequency and an amplitude.

The signal generator is configured to generate at least one periodic output signal. The output signal comprises a triangular-waveform signal. A frequency and an amplitude of the output signal are adjustable. The signal generator is configured to receive at least one input parameter. The input parameter comprises at least one piece of information about a setpoint amplitude and a setpoint frequency of the output signal. The signal generator has at least one processing unit. The processing unit is configured to determine a signal direction of the output signal. The processing unit is configured to determine a step size. The processing unit is configured to apply the step size to an actual amplitude on the basis of the signal direction for a number of clock cycles. The number of clock cycles is dependent on the setpoint frequency of the output signal.

The term "periodic output signal" as used here is a broad term which is intended to be accorded its customary and familiar meaning as understood by a person skilled in the art. The term is not restricted to a specific or adapted meaning. The term can refer, without restriction, in particular to an output signal that repeats over time. A "triangular-waveform signal" can be understood to mean a triangular-waveform oscillation. The triangular-waveform signal can have a characteristic timing trend. For example the triangular-waveform signal can rise linearly to a maximum and then fall linearly to a minimum. Other timing trends are also conceivable. For example the triangular-waveform signal can first fall to the minimum and then rise linearly to the maximum. The triangular-waveform signal can have a plurality of repetitions, in particular periodic repetitions.

The term "adjustable" as used here is a broad term which is intended to be accorded its customary and familiar meaning as understood by a person skilled in the art. The term is not restricted to a specific or adapted meaning. The term can refer, without restriction, in particular to a changing and/or an adapting of the frequency and amplitude. The frequency and the amplitude can be set to a setpoint frequency and a setpoint amplitude. The terms "setpoint frequency" and "setpoint amplitude" as used here are broad terms which are intended to be accorded their customary and familiar meaning as understood by a person skilled in the art. The terms are not restricted to a specific or adapted meaning. The terms can refer, without restriction, in particular to a desired frequency and a desired amplitude. For example the signal generator can generate an output signal having an actual frequency and an actual amplitude and the frequency and the amplitude can be set to the setpoint frequency and the setpoint amplitude. The actual frequency and the actual amplitude may be present values of the frequency and the amplitude. The setpoint frequency and the actual frequency may be ≥0.

The term "input parameter" as used here is a broad term which is intended to be accorded its customary and familiar meaning as understood by a person skilled in the art. The term is not restricted to a specific or adapted meaning. The term can refer, without restriction, in particular to at least one input value and/or at least one input quantity on the basis of which the output signal is generated. The input parameter may be a value of a variable, for example. The input parameter may be a preprocessed input parameter that was generated in at least one preprocessing step. The input parameter comprises at least one piece of information about a setpoint amplitude and a setpoint frequency of the output signal. The information about the setpoint amplitude and the setpoint frequency can comprise values for setpoint amplitude and setpoint frequency and/or further quantities determined from these.

The signal generator can comprise at least one interface that is configured to receive the information about the setpoint amplitude and the setpoint frequency. The term "receive" as used here is a broad term which is intended to be accorded its customary and familiar meaning as understood by a person skilled in the art. The term is not restricted to a specific or adapted meaning. The term can refer, without restriction, in particular to input of the information for example via a human-machine interface, such as for example an input/output apparatus such as a display and/or a keyboard, and/or to a data transfer using at least one communication interface. The signal generator can comprise for example at least one communication interface that is configured to provide at least one connection, in particular an LAN or SPI connection, to a further computer unit and to allow a data transfer of the information from the computer unit to the signal generator.

The signal generator has at least one processing unit. The term "processing unit" as used here is a broad term which is intended to be accorded its customary and familiar meaning as understood by a person skilled in the art. The term is not restricted to a specific or adapted meaning. The term can refer, without restriction, in particular to a data processing apparatus that is configured to evaluate the information about setpoint amplitude and setpoint frequency and to determine an output signal. The processing unit can have at least one microcontroller, at least one field programmable gate array (FPGA) or at least one processor.

The processing unit is configured to determine a signal direction of the output signal. The term "signal direction" as used here is a broad term which is intended to be accorded its customary and familiar meaning as understood by a person skilled in the art. The term is not restricted to a specific or adapted meaning. The term can refer, without restriction, in particular to a timing trend of the output signal. The signal direction may be a counting direction. The signal direction may be positive or negative. A positive signal direction may be a signal direction that involves the signal trending from a starting point, for example a minimum or an axis zero point, to a maximum. A negative signal direction may be a signal direction that involves the signal trending from a starting point, for example a maximum or an axis zero point, to a minimum. The term "determining the signal direction" as used here is a broad term which is intended to be accorded its customary and familiar meaning as understood by a person skilled in the art. The term is not restricted to a specific or adapted meaning. The term can refer, without restriction, in particular to defining a signal direction, for example on the basis of a previous signal trend.

The signal generator may be configured to determine the triangular-waveform signal by adding or subtracting a constant value to or from a present value for a specific number of clock cycles. It is thus always possible to count the same time downward and the same time upward.

The processing unit is configured to determine a step size. The term "step size" as used here is a broad term which is intended to be accorded its customary and familiar meaning as understood by a person skilled in the art. The term is not restricted to a specific or adapted meaning. The term can refer, without restriction, in particular to a characteristic quantity that indicates the value per clock cycle of the signal generator that needs to be added to or subtracted from the actual amplitude to achieve the setpoint amplitude. The step size may be ≥0. The step size may be predetermined, in particular can be provided to the signal generator. The step size may be predetermined by a data preprocessing, for example, and/or can be input.

The processing unit may be configured to determine a triangular-waveform signal. The processing unit may be configured to determine the triangular-waveform signal by carrying out the following steps:

a) determining a starting variable n0, wherein, depending on the signal direction, the determining comprises adding or subtracting a step size to or from a starting value, where n0=n0+(step size*signal direction), wherein the step size is dependent on the setpoint amplitude and the setpoint frequency of the output signal;

b) limiting the starting variable determined in a);

c) storing the limited starting variable as a triangular-waveform signal.

The processing unit may be configured to adapt the signal direction of the output signal, in particular afresh, after step c).

The term "starting variable" as used here is a broad term which is intended to be accorded its customary and familiar meaning as understood by a person skilled in the art. The term is not restricted to a specific or adapted meaning. The term can refer, without restriction, in particular to a starting value of a fundamentally arbitrary variable. The starting variable n0 may be ≥0 or ≤0. The starting variable may be an arbitrary positive or negative integer.

The term "clock cycle" as used here is a broad term which is intended to be accorded its customary and familiar meaning as understood by a person skilled in the art. The term is not restricted to a specific or adapted meaning. The term can refer, without restriction, in particular to a unit of time, in particular of an internal clock of the signal generator that the latter uses. The clock cycle can be generated by at least one clock generator. Periodic signals have four sectors, also referred to as signal sectors, on a standard circle. A number of clock cycles per sector that is needed for the setpoint frequency "freq" can be determined by $$ClockCyclesPerSector = \frac{ClockFrequency}{freq*4},$$

where "ClockFrequency" is the clock frequency of the signal generator. A "clock frequency" can be understood to mean a number of pulses per second. For example the signal generator can comprise an FPGA. For example the clock frequency may be 20 kHz.

The step size can be determined as $$\text{step size} = \frac{amp}{ClockCyclesPerSector},$$

where amp is an amplitude of the output signal to be generated. When an FPGA is used as signal generator, the step size may be $$\text{step size} = \frac{amp*256}{ClockCyclesPerSector}.$$

The FPGA may be configured to calculate the output signal to be a factor of 256 greater. This permits decimal places to be allowed for, which is not normally possible with an FPGA. The output signal can thus be calculated to be much greater than it actually is, so that the decimal places slide into the integers. The factor of 256 allows for the FPGA calculating the output signal with a scaling of 256.

The term "limiting the starting variable" as used here is a broad term which is intended to be accorded its customary and familiar meaning as understood by a person skilled in the art. The term is not restricted to a specific or adapted meaning. The term can refer, without restriction, in particular to a limiting to the setpoint amplitude, in particular to a positive maximum or a negative minimum. The processing unit may be configured so as, in step b), to determine a scaled amplitude n1, with n1=amp*nscale, where amp is the setpoint amplitude and nscale is a scaling factor, and to limit the determined starting variable to the scaled amplitude. When an FPGA is used as signal generator, nscale may be 256, for example, which is consistent with a shift by 8 bits to the left. In the event of a shift by one bit to the left, the value can be multiplied by a factor of 2. This can permit decimal places to be allowed for, as described above.

The triangular-waveform signal can be generated from the step size and the signal direction by executing a program code, in particular a program code in the programming language C or a VHDL code. The processing unit may be configured to execute the program code.

For example the program code may be designed to generate the triangular-waveform signal by means of an FPGA as follows:

| | |
|---|---|
| n = step size*signal direction; | (1) |
| n0 = n0 + n; | (2) |
| n1 = amp*256; | (3) |
| n0 = lim(n0,n1); | (4) |
| triangle = n0 >>8; | (5) |
| n2 = lim__sts(triangle, amp); | (6) |
| if (n2 !=0){ | (7) |
| SignalDirection = SignalDirection * (−1); | (8) |
| } | (9) |

The signal direction is defined in lines (1) and (6) to (9). The function "lim_sts" in line 6 returns a 1 if the variable "triangle" is above the positive setpoint amplitude "amp", a −1 is returned if the variable "triangle" is below the negative setpoint amplitude, and a 0 is returned if the value of the variable "triangle" is within the negative and positive setpoint amplitudes "amp". In the event of a positive setpoint amplitude being reached and in the event of a negative setpoint amplitude being reached, the signal direction is intended to be reversed. Line (2) causes the step size to be added or subtracted on the basis of the variable "SignalDirection". The variable "step size" can be determined in a data preprocessing. Line (3) multiplies the setpoint amplitude by the factor of 256, which is consistent with a shift by 8 bits to the left. In line (4), the value of the variable "n0" is limited to the maximum setpoint amplitude, positive or negative, that was multiplied by a factor of 256 (variable "n1"). The triangular-waveform signal having the setpoint amplitude is generated in line (5). The triangular-waveform signal is generated from the variable "n0", which is divided by the factor of 256, this being consistent with a shift by 8 bits to the right. In the event of a shift by one bit to the write, a value can be multiplied by a factor of 2.

The processing unit is configured to apply the step size to an actual amplitude on the basis of the signal direction for a number of clock cycles. The number of clock cycles is dependent on the setpoint frequency of the output signal. The step size may have been or can be determined from the number of clock cycles, in particular. The processing unit may be configured to add the step size to the actual amplitude of the output signal or to subtract the step size from the actual amplitude on the basis of the signal direction.

The signal generator may furthermore be configured to generate at least one square-wave signal. The term "square-wave signal" as used here is a broad term which is intended to be accorded its customary and familiar meaning as understood by a person skilled in the art. The term is not restricted to a specific or adapted meaning. The term can refer, without restriction, in particular to a periodic signal that switches to and fro between two substantially constant values. "Substantially constant value" can be understood to mean that divergences from a constant of ≤5%, preferably of ≤1%, are possible. The square-wave signal can in particular be generated simultaneously with the triangular-waveform signal. Additionally, the square-wave signal can be generated from the triangular-waveform signal. When the triangular-waveform signal counts upward the positive complete amplitude that was set can be output, and when the triangular-waveform signal counts downward the negative complete amplitude can be output. The processing unit may be configured to determine the square-wave signal from the signal direction and the setpoint amplitude. To generate the square-wave signal, the processing unit may be configured to execute a program code. The program code can in particular have further steps in addition to the program code described above in order to generate the square-wave signal.

For example the square-wave signal can be determined by inserting a further line between lines (5) and (6):

square=SignalDirection*amp;

This additional line means that when the triangular-waveform signal counts in a positive direction the maximum positive amplitude can be stored and when the triangular-waveform signal counts in a negative direction the maximum negative desired amplitude can be stored in the variable "square".

The signal generator may furthermore be configured to generate at least one sine wave signal. The term "sine wave signal" as used here is a broad term which is intended to be accorded its customary and familiar meaning as understood by a person skilled in the art. The term is not restricted to a specific or adapted meaning. The term can refer, without restriction, in particular to a periodic signal that is substantially sinusoidal. "Substantially sinusoidal" can be understood to mean that divergences from a sine wave function of ≤5%, preferably of ≤1%, are possible. The sine wave signal can in particular be generated simultaneously with the triangular-waveform signal. The calculation of a genuine sine wave signal can be very complex. Each individual value would in particular require a series expansion to be carried out. The signal generator may be configured to approximate the sine wave signal by means of quadratic functions. The processing unit may be configured to determine and generate the sine wave signal by squaring and scaling the triangular-waveform signal. To generate the sine wave signal, the processing unit may be configured to execute a program code. The program code can in particular have further steps in addition to the program code described above in order to generate the sine wave signal. For example the sine wave signal can be determined and generated by inserting multiple further lines between lines (5) and (6):

sine_1 = triangle*triangle;
    sine_2 = sine_1*SineWaveCoefficient;
    sine_3 = sine_2 >>16;
    sine_4 = amp − sine_3;
    sine_5 = sine_4*SignalDirection;

First, the triangular-waveform signal is squared according to this program code, which means that a signal having parabolas open at the top is produced. Next, the signal is scaled by multiplying it by the variable "SineWaveCoefficient" and shifting it 16 bits to the right. The variable "SineWaveCoefficient" can be determined in a data preprocessing. The shape of the signal can remain unchanged. The sine wave coefficient can be determined for an FPGA by means of $$\text{sine wave coefficient} = \frac{65535}{amp},$$

where amp is the setpoint amplitude. The number 65535=256*256 allows for the squaring of the triangular-waveform signal. In the program code line for determining the variable "sine_4", the parabolas can be mirrored horizontally. In the last line of the program code, the sine wave signal is generated with the setpoint amplitude and the setpoint frequency.

By way of example, the program code may be designed to simultaneously generate a triangular-waveform signal, a square-wave signal and a sine wave signal by means of an FPGA as follows:

n = step size*signal direction;
    n0 = n0 + n;
    n1 = amp*256;
    n0 = lim(n0,n1);
    triangle = n0 >>8;
    sine_1 = triangle*triangle;
    sine_2 = sine_1*SineWaveCoefficient;
    sine_3 = sine_2 >>16;
    sine_4 = amp − sine_3;
    sine_5 = sine_4*SignalDirection;
    square = SignalDirection*amp;
    n2 = lim_sts(triangle, amp);
    if (n2 !=0){
    SignalDirection = SignalDirection * (−1);
    }

The signal generator according to the invention permits simultaneous generation and provision of three periodic output signals. This can be achieved by virtue of the individual signals being generated on the basis of one another. The program code can be executed in the processing unit, in particular inside the FPGA. The program code can also comprise just calculations that are not complex for an FPGA, such as multiplication, bit shifting, adding and logic functions, which means that the program code is resource-saving. Operations that are complex for an FPGA, such as divisions and calculation of numbers having decimal places, can be calculated on external computing units, which can perform these operations with much lower resource involvement. Furthermore, the signal generator can reproduce a sine wave signal by means of quadratic functions, which means that a large amount of computing power can be saved. Generating output signals is thus also possible by means of very small FPGAs, which are very much less expensive than large FPGAs. Previously known function generators were implementable in an FPGA only with great difficulty, since calculation of the signals is very complex and resource-intensive. The signal generator according to the invention may be optimized to be implementable in an FPGA very well and in a resource-saving manner as a result of dividing only by means of bit shifting and otherwise merely multiplications, additions and subtractions. However, it is also conceivable for the signal generator to be calculated in a microcontroller too.

In a further aspect of the present invention, a system for generating at least one output signal is proposed. The term "system" as used here is a broad term which is intended to be accorded its customary and familiar meaning as understood by a person skilled in the art. The term is not restricted to a specific or adapted meaning. The term can refer, without restriction, in particular to an apparatus comprising at least two elements, which interact in particular in terms of function. The system may be a hardware system. The system comprises at least one signal generator according to the invention. For details and embodiments with regard to the system, reference is made to the description of the signal generator according to the invention.

The system has at least one computing unit. The term "computing unit" as used here is a broad term which is intended to be accorded its customary and familiar meaning as understood by a person skilled in the art. The term is not restricted to a specific or adapted meaning. The term can refer, without restriction, in particular to an apparatus for data processing, for example a microcontroller, a PC or a laptop. As stated above, the signal generator can comprise at least one FPGA. An FPGA can calculate exclusively integer values, also referred to as integers, that is to say numbers without decimal places. Another difficulty for an FPGA may be dividing by any numbers, which takes up a large amount of resources. Bit shifting and multiplying are much more resource-saving. According to the invention, it is therefore proposed that complex operations be relocated to an external computing unit and only resource-saving operations be left on the processing unit of the signal generator, in particular the FPGA. Parameterization data can thus be preprocessed by the external computing unit and the preprocessed information can be conveyed to the signal generator.

The system has at least one communication interface. The term "communication interface" as used here is a broad term which is intended to be accorded its customary and familiar meaning as understood by a person skilled in the art. The term is not restricted to a specific or adapted meaning. The term can refer, without restriction, in particular to an interface that is configured to transmit information. In particular, the communication interface may be configured to transmit information from a computing unit, e.g. a computer, in order to send or output information, e.g. to another device. The communication interface may additionally or alternatively be configured to transmit information to a computing apparatus, e.g. to a computer, for example in order to obtain information. The communication interface can especially provide means for transmitting or exchanging information. The communication interface can in particular provide a data transmission connection, e.g. Bluetooth, NFC, inductive coupling or the like. The communication interface can provide an LAN connection or an SPI connection, for example. The at least one piece of information about the setpoint amplitude and the setpoint frequency of the output signal is inputtable into the communication interface. The computing unit is configured to preprocess the input information about the setpoint amplitude and the setpoint frequency and to transmit the information to the signal generator. The computing unit can comprise at least one user computer, for example. The user can input a setpoint frequency in Hz and a setpoint amplitude in integer increments into the user computer. The data preprocessing can take place on the user computer, and/or the computing unit can have a further computing unit, which is configured for a data preprocessing.

The preprocessing of the input information can comprise determining at least one input parameter for the signal generator. The input parameter may be one clock frequency per signal sector. The computing unit may be configured to determine the clock frequency per signal sector by means of $$ClockCyclesPerSector = \frac{ClockFrequencyFPGA}{freq*4},$$

where ClockFrequencyFPGA is a predetermined clock frequency of the signal generator and freq is a frequency of the output signal to be generated. The input parameter may alternatively or additionally be a step size. The computing unit may be configured to determine the step size by means of $$\text{step size} = \frac{amp}{ClockCyclesPerSector},$$

where amp is an amplitude of the output signal to be generated. Alternatively or additionally, the input parameter may be a sine wave coefficient. In particular in the case of an FPGA as signal generator, the computing unit may be configured to determine the sine wave coefficient by means of $$\text{sine wave coefficient} = \frac{65535}{amp},$$

where amp is an amplitude of the output signal to be generated.

The system can have at least one computer environment. The computer environment can have at least one microcontroller, at least one field programmable gate array (FPGA) or at least one processor of a computer. At least part of the signal generator may be implemented in the computer environment.

In a further aspect of the present invention, a method for generating at least one periodic output signal by means of at least one signal generator according to the invention is proposed. The output signal comprises a triangular-waveform signal. The method comprises setting a frequency and an amplitude of the output signal.

The method comprises the following steps:
i) receiving at least one input parameter, wherein the input parameter comprises at least one piece of information about a setpoint amplitude and a setpoint frequency of the output signal,
ii) determining a signal direction of the output signal by means of at least one processing unit;
iii) determining a step size by means of the processing unit and applying the step size to an actual amplitude on the basis of the signal direction for a number of clock cycles, wherein the number of clock cycles is dependent on the setpoint frequency of the output signal.

The method steps can be carried out in the order indicated, wherein one or more of the steps can at least in part also be carried out simultaneously and wherein one or more of the steps can be repeated multiply. Furthermore, further steps can additionally be performed independently of whether or not they are mentioned in the present application. For details and embodiments with regard to the method, reference is made to the description of the signal generator according to the invention and the system according to the invention.

The method for determining the triangular-waveform signal can also have the following steps:
iv) determining a starting variable n0, wherein, depending on the signal direction, the determining comprises adding or subtracting a step size to or from a starting value, where n0=n0+(step size*signal direction), wherein the step size is dependent on the setpoint amplitude and the setpoint frequency of the output signal;
v) limiting the starting variable determined in iv);
vi) storing the limited starting variable as a triangular-waveform signal.

Step v) can involve determining a scaled amplitude n1, with n1=amp*nscale, where amp is the setpoint amplitude and nscale is a scaling factor, and limiting the determined starting variable to the scaled amplitude. The signal direction of the output signal can be adapted after step vi).

The method can comprise generating at least one square-wave signal, in particular simultaneously with the triangular-waveform signal. The square-wave signal can be determined from the signal direction and the setpoint amplitude.

The method can comprise generating at least one sine wave signal, in particular simultaneously with the triangular-waveform signal. The sine wave signal can be determined and generated by squaring and scaling the triangular-waveform signal.

The method can have at least one preprocessing step, in which the at least one input parameter, in particular a plurality of input parameters, is provided.

Furthermore, a computer program is proposed within the scope of the present invention, which computer program, when executed on a computer or computer network, for example a cloud, carries out the method according to the invention, in particular method steps i) to iii), in one of its configurations. Furthermore, a computer program comprising program code means is proposed within the scope of the present invention, in order to carry out the method according to the invention in one of its configurations when the program is executed on a computer or computer network. In particular, the program code means can be stored on a computer-readable data medium. Additionally, a data medium is proposed within the scope of the present invention, which data medium stores a data structure that, after being loaded into a random access memory and/or main memory of a computer or computer network, can carry out the method according to the invention in one of its configurations. A computer program product comprising program code means stored on a machine-readable medium is also proposed within the scope of the present invention, in order to carry out the method according to the invention in one of its configurations when the program is executed on a computer or computer network. A computer program product is understood to mean the program as a tradable product. In principle, it can be present in any form, for example on paper or on a computer-readable data medium, and, in particular, it can be distributed via a data transmission network. By way of example, the evaluation of the image material that is produced and/or has been produced may be available as a web service, for example via a secure connection to manufacturer servers. This can be advantageous if adequate computer resources cannot be kept in situ. Finally, a modulated data signal is proposed within the scope of the present invention, which modulated data signal contains instructions, which are executable by a computer system or computer network, for carrying out a method according to any one of the embodiments described.

In a further aspect of the present invention, a use of a signal generator according to the invention in a computer environment is proposed. The computer environment has a microcontroller, at least one integrated circuit, in particular a field programmable gate array (FPGA), or a processor of a computer.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In summary, the following embodiments are particularly preferred within the scope of the present invention:

Embodiment 1

Signal generator, wherein the signal generator is configured to generate at least one periodic output signal, wherein the output signal comprises a triangular-waveform signal, wherein a frequency and an amplitude of the output signal are adjustable, wherein the signal generator is configured to receive at least one input parameter, wherein the input parameter comprises at least one piece of information about a setpoint amplitude and a setpoint frequency of the output signal, wherein the signal generator has at least one processing unit, wherein the processing unit is configured to determine a signal direction of the output signal, wherein the processing unit is configured to determine a step size, wherein the processing unit is configured to apply the step size to an actual amplitude on the basis of the signal direction for a number of clock cycles, wherein the number of clock cycles is dependent on the setpoint frequency of the output signal.

Embodiment 2

Signal generator according to the preceding embodiment, wherein the processing unit is configured to determine the triangular-waveform signal by carrying out the following steps:
a) determining a starting variable n0, wherein, depending on the signal direction, the determining comprises adding or subtracting a step size to or from a starting value, where n0=n0+(step size*signal direction), wherein the step size is dependent on the setpoint amplitude and the setpoint frequency of the output signal;
b) limiting the starting variable determined in a);
c) storing the limited starting variable as a triangular-waveform signal.

Embodiment 3

Signal generator according to the preceding embodiment, wherein the processing unit is configured so as, in step b), to determine a scaled amplitude n1, with n1=amp*nscale, where amp is the setpoint amplitude and nscale is a scaling factor, and to limit the determined starting variable to the scaled amplitude.

Embodiment 4

Signal generator according to either one of the two preceding embodiments, wherein the processing unit is configured to adapt the signal direction of the output signal after step c).

Embodiment 5

Signal generator according to any one of the preceding embodiments, wherein the processing unit is configured to add the step size to the actual amplitude of the output signal or to subtract the step size from the actual amplitude on the basis of the signal direction.

Embodiment 6

Signal generator according to any one of the preceding embodiments, wherein the signal generator is furthermore configured to generate at least one square-wave signal, in particular simultaneously with the triangular-waveform signal.

Embodiment 7

Signal generator according to the preceding embodiment, wherein the processing unit is configured to determine the square-wave signal from the signal direction and the setpoint amplitude.

Embodiment 8

Signal generator according to any one of the preceding embodiments, wherein the signal generator is furthermore configured to generate at least one sine wave signal, in particular simultaneously with the triangular-waveform signal.

Embodiment 9

Signal generator of the preceding embodiment, wherein the processing unit is configured to determine and generate the sine wave signal by squaring and scaling the triangular-waveform signal.

Embodiment 10

Signal generator according to any one of the preceding embodiments, wherein the processing unit has at least one microcontroller, at least one field programmable gate array (FPGA) or at least one processor.

Embodiment 11

System for generating at least one output signal, wherein the system comprises at least one signal generator according to any one of the preceding embodiments relating to a signal generator, wherein the system has at least one computing unit, wherein the system has at least one communication interface, wherein at least one piece of information about a setpoint amplitude and a setpoint frequency of the output signal is inputtable into the communication interface, wherein the computing unit is configured to preprocess the input information about the setpoint amplitude and the setpoint frequency and to transmit the information to the signal generator.

Embodiment 12

System according to any one of the preceding embodiments relating to a system, wherein the computing unit comprises at least one user computer.

Embodiment 13

System according to the preceding embodiment, wherein the computing unit has a further computing unit, which is configured for a data preprocessing.

Embodiment 14

System according to any one of the preceding embodiments relating to a system, wherein the system has at least one computer environment, wherein the computer environment has at least one microcontroller, at least one field programmable gate array (FPGA) or at least one processor of a computer, wherein at least part of the signal generator is implemented in the computer environment.

Embodiment 15

System according to the preceding embodiment, wherein the preprocessing of the input information comprises determining at least one input parameter for the signal generator.

Embodiment 16

Method for generating at least one periodic output signal by means of at least one signal generator according to any one of the preceding embodiments relating to a signal generator, wherein the output signal comprises a triangular-waveform signal, wherein the method comprises setting a frequency and an amplitude of the output signal, wherein the method comprises the following steps:
 i) receiving at least one input parameter, wherein the input parameter comprises at least one piece of information about a setpoint amplitude and a setpoint frequency of the output signal,
 ii) determining a signal direction of the output signal by means of at least one processing unit;
 iii) determining a step size by means of the processing unit and applying the step size to an actual amplitude on the basis of the signal direction for a number of clock cycles, wherein the number of clock cycles is dependent on the setpoint frequency of the output signal.

Embodiment 17

Method according to the preceding embodiment, wherein the method for determining the triangular-waveform signal also has the following steps:
 iv) determining a starting variable n0, wherein, depending on the signal direction, the determining comprises adding or subtracting a step size to or from a starting value, where n0=n0+(step size*signal direction), wherein the step size is dependent on the setpoint amplitude and the setpoint frequency of the output signal;
 v) limiting the starting variable determined in iv);
 vi) storing the limited starting variable as a triangular-waveform signal.

Embodiment 18

Method according to the preceding embodiment, wherein step v) involves determining a scaled amplitude n1, with n1=amp*nscale, where amp is the setpoint amplitude and nscale is a scaling factor, and limiting the determined starting variable to the scaled amplitude.

Embodiment 19

Method according to either one of the two preceding embodiments, wherein the signal direction of the output signal is adapted after step vi).

Embodiment 20

Method according to any one of the preceding embodiments relating to a method, wherein the method comprises generating at least one square-wave signal, in particular simultaneously with the triangular-waveform signal.

Embodiment 21

Method according to the preceding embodiment, wherein the square-wave signal is determined from the signal direction and the setpoint amplitude.

Embodiment 22

Method according to any one of the preceding embodiments relating to a method, wherein the method comprises generating at least one sine wave signal, in particular simultaneously with the triangular-waveform signal.

Embodiment 23

Method according to the preceding embodiment, wherein the sine wave signal is determined and generated by squaring and scaling the triangular-waveform signal.

Embodiment 24

Method according to any one of the preceding embodiments relating to a method, wherein the method comprises at least one preprocessing step, in which the at least one input parameter is provided.

Embodiment 25

Use of a signal generator according to any one of the preceding embodiments relating to a signal generator in a computer environment, wherein the computer environment has a microcontroller, at least one integrated circuit, in particular a field programmable gate array (FPGA), or a processor of a computer.

BRIEF DESCRIPTION OF THE DRAWINGS

Further details and features of the invention will become apparent from the following description of example embodiments, in particular in conjunction with the dependent claims. In this case, the respective features can be realized by themselves or as a plurality in combination with one another. The invention is not restricted to the example embodiments. The example embodiments are illustrated schematically in the figures. Identical reference numerals in the individual figures denote identical or functionally identical elements or elements corresponding to one another with regard to their functions.

DETAILED DESCRIPTION

Figure 1:
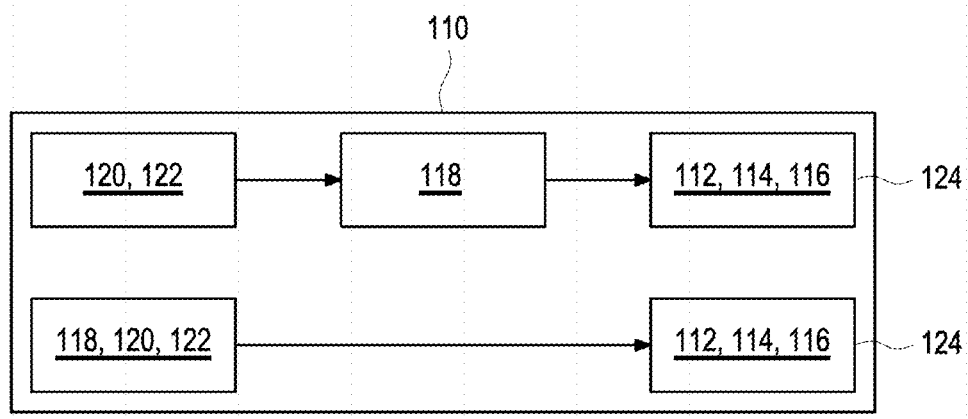
FIG. 1 shows two embodiments of a system according to the invention.

FIG. 1 shows a schematic depiction of a system 110 according to the invention for generating at least one output signal. The system 110 may be a hardware system. The system 110 comprises at least one signal generator 112 according to the invention.

The output signal may be a voltage. The output signal can have a frequency and an amplitude. The signal generator 112 is configured to generate at least one periodic output signal. The output signal comprises a triangular-waveform signal. The triangular-waveform signal can have a characteristic timing trend. For example the triangular-waveform signal can rise linearly to a maximum and then fall linearly to a minimum. Other timing trends are also conceivable. For example the triangular-waveform signal can first fall to the minimum and then rise linearly to the maximum. The triangular-waveform signal can have a plurality of repetitions, in particular periodic repetitions.

A frequency and an amplitude of the output signal are adjustable. The frequency and the amplitude can be set to a setpoint frequency and a setpoint amplitude. For example the signal generator can generate an output signal having an actual frequency and an actual amplitude and the frequency and the amplitude can be set to the setpoint frequency and the setpoint amplitude. The actual frequency and the actual amplitude may be present values of the frequency and the amplitude.

The signal generator 112 is configured to receive at least one input parameter. The input parameter comprises at least one piece of information about a setpoint amplitude and a setpoint frequency of the output signal. The input parameter may be a value of a variable, for example. The input parameter may be a preprocessed input parameter that was generated in at least one preprocessing step. The input parameter comprises at least one piece of information about a setpoint amplitude and a setpoint frequency of the output signal. The information about the setpoint amplitude and the setpoint frequency can comprise values for setpoint amplitude and setpoint frequency and/or further quantities determined from these.

The signal generator 112 can comprise at least one interface 114 that is configured to receive the information about the setpoint amplitude and the setpoint frequency. The interface 114 may be configured for input of the information for example via a human-machine interface, such as for example an input/output apparatus such as a display and/or a keyboard, and/or for a data transfer using at least one communication interface. The signal generator 112 can comprise for example at least one communication interface that is configured to provide at least one connection, in particular an LAN or SPI connection, to a further computer unit and to allow a data transfer of the information from the computer unit to the signal generator 112.

The signal generator 112 has at least one processing unit 116. The processing unit 116 may be configured to evaluate the information about setpoint amplitude and setpoint frequency and to determine an output signal. The processing unit 116 can have at least one microcontroller, at least one field programmable gate array (FPGA) or at least one processor. The processing unit 116 may also be just an FPGA. The microcontroller may be the number 118 and the at least one processor may be the number 122.

The processing unit 116 is configured to determine a signal direction of the output signal. The signal direction may be a counting direction. The signal direction may be positive or negative. A positive signal direction may be a signal direction that involves the signal trending from a starting point, for example a minimum or an axis zero point, to a maximum. A negative signal direction may be a signal direction that involves the signal trending from a starting point, for example a maximum or an axis zero point, to a minimum.

The processing unit 116 is configured to determine a step size. The processing unit 116 is configured to apply the step size to an actual amplitude on the basis of the signal direction for a number of clock cycles. The number of clock cycles is dependent on the setpoint frequency of the output signal. The signal generator 112 may be configured to determine the triangular-waveform signal by adding or subtracting a constant value to or from a present value for a specific number of clock cycles. It is thus always possible to count the same time downward and the same time upward. The processing unit may be configured to determine the triangular-waveform signal by carrying out the following steps:

a) determining a starting variable n0, wherein, depending on the signal direction, the determining comprises adding or subtracting a step size to or from a starting value, where n0=n0+(step size*signal direction), wherein the step size is dependent on the setpoint amplitude and the setpoint frequency of the output signal;

b) limiting the starting variable determined in a);

c) storing the limited starting variable as a triangular-waveform signal.

The processing unit 116 may be configured to adapt the signal direction of the output signal, in particular afresh, after step c).

The starting variable n0 may be ≥0 or ≤0. The starting variable may be an arbitrary positive or negative integer. The step size can indicate the value per clock cycle of the signal generator 112 that needs to be added to or subtracted from the actual amplitude to achieve the setpoint amplitude. The clock cycle may be a unit of time, in particular of an internal clock of the signal generator 112 that the latter uses. The clock cycle can be generated by at least one clock generator. Periodic signals have four sectors, also referred to as signal sectors, on a standard circle. A number of clock cycles per sector that is needed for the setpoint frequency "freq" can be determined by $$ClockCyclesPerSector = \frac{ClockFrequency}{freq * 4},$$

where "ClockFrequency" is the clock frequency of the signal generator. For example the signal generator can comprise an FPGA. For example the clock frequency may be 20 kHz. The step size can be determined as $$\text{Step size} = \frac{amp}{ClockCyclesPerSector},$$

where amp is an amplitude of the output signal to be generated. When an FPGA is used as signal generator, the step size may be $$\text{Step size} = \frac{amp * 256}{ClockCyclesPerSector}.$$

The FPGA may be configured to calculate the output signal to be a factor of 256 greater. This permits decimal places to be allowed for, which is not normally possible with an FPGA. The output signal can thus be calculated to be much greater than it actually is, so that the decimal places slide into the integers. The factor of 256 allows for the FPGA calculating the output signal with a scaling of 256.

The limiting of the starting variable can comprise a limiting to the setpoint amplitude, in particular to a positive maximum or a negative minimum. The processing unit 116 may be configured so as, in step b), to determine a scaled amplitude n1, with n1=amp*nscale, where amp is the setpoint amplitude and nscale is a scaling factor, and to limit the determined starting variable to the scaled amplitude. When an FPGA is used as signal generator 112, nscale may be 256, for example, which is consistent with a shift by 8 bits to the left. In the event of a shift by one bit to the left, the value can be multiplied by a factor of 2. This can permit decimal places to be allowed for.

The system 110 has at least one computing unit 118. The computing unit 118 can comprise at least one apparatus for data processing, for example a microcontroller, a PC or a laptop. As stated above, the signal generator 112 can comprise at least one FPGA. FPGAs can calculate exclusively integer values, also referred to as integers, that is to say numbers without decimal places. Another difficulty for an FPGA may be dividing by any numbers, which takes up a large amount of resources. Bit shifting and multiplying are much more resource-saving. According to the invention, it is therefore proposed that complex operations be relocated to an external computing unit 118 and only resource-saving operations be left on the processing unit of the signal generator 112, in particular the FPGA. Parameterization data can thus be preprocessed by the external computing unit 118 and the preprocessed information can be conveyed to the signal generator.

The system 110 has at least one communication interface 120. In particular, the communication interface 120 may be configured to transmit information from a computing unit, e.g. a computer, in order to send or output information, e.g. to another device. The communication interface 120 may additionally or alternatively be configured to transmit information to a computing apparatus, e.g. to a computer, for example in order to obtain information. The communication interface 120 can especially provide means for transmitting or exchanging information. The communication interface 120 can in particular provide a data transmission connection, e.g. Bluetooth, NFC, inductive coupling or the like. The communication interface 120 can provide an LAN connection or an SPI connection, for example. The at least one piece of information about the setpoint amplitude and the setpoint frequency of the output signal is inputtable into the communication interface 120. The computing unit 118 is configured to preprocess the input information about the setpoint amplitude and the setpoint frequency and to transmit the information to the signal generator 112. The computing unit 118 can comprise at least one user computer 122, for example. The user can input a setpoint frequency in Hz and a setpoint amplitude in integer increments into the user computer 122. The data preprocessing can take place on the user computer 122, and/or the computing unit 118 can have a further computing unit, which is configured for a data preprocessing. FIG. 1 shows both options by way of example.

The preprocessing of the input information can comprise determining at least one input parameter for the signal generator 112. The input parameter may be one clock frequency per signal sector. The computing unit 118 may be configured to determine the clock frequency per signal sector by means of $$ClockCyclesPerSector = \frac{ClockFrequencyFPGA}{freq * 4},$$

where ClockFrequencyFPGA is a predetermined clock frequency of the signal generator 112 and freq is a frequency of the output signal to be generated. The input parameter may alternatively or additionally be a step size. The computing unit may be configured to determine the step size by means of $$\text{Step size} = \frac{amp}{ClockCyclesPerSector},$$

where amp is an amplitude of the output signal to be generated. Alternatively or additionally, the input parameter may be a sine wave coefficient. In particular in the case of an FPGA as signal generator 112, the computing unit may be configured to determine the sine wave coefficient by means of $$\text{sine wave coefficient} = \frac{65535}{amp},$$

where amp is an amplitude of the output signal to be generated.

The system 110 can have at least one computer environment 124. The computer environment 124 can have at least one microcontroller, at least one field programmable gate array (FPGA) or at least one processor of a computer. At least part of the signal generator 112 may be implemented in the computer environment 124.

Figure 2:
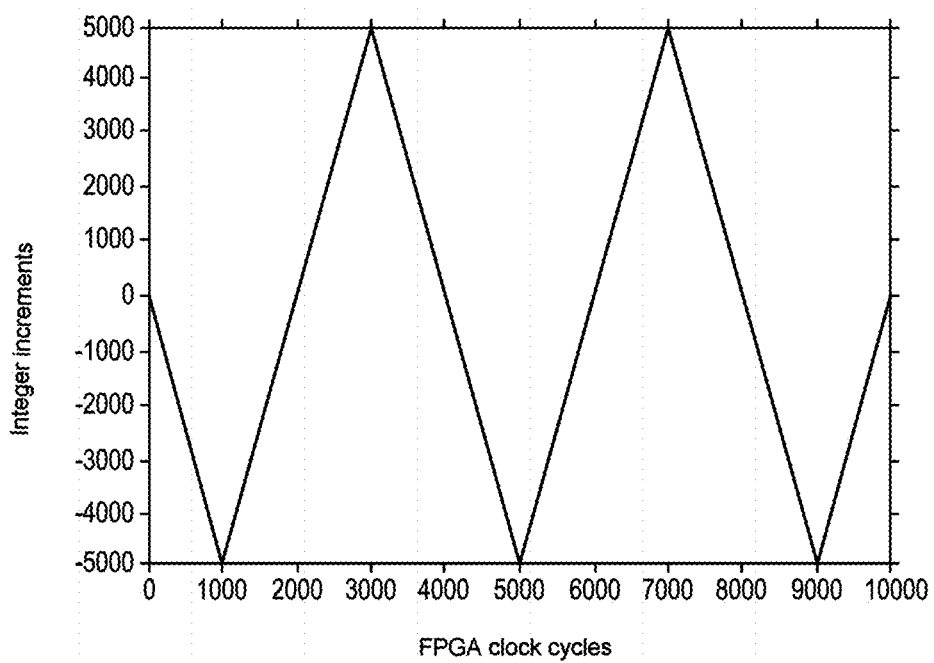
FIG. 2 shows an example of a generated triangular-waveform signal.

The processing unit 116 is configured to apply the step size to an actual amplitude on the basis of the signal direction for a number of clock cycles. The number of clock cycles is dependent on the setpoint frequency of the output signal. The step size may have been or can be determined from the number of clock cycles, in particular. The processing unit 116 may be configured to add the step size to the actual amplitude of the output signal or to subtract the step size from the actual amplitude on the basis of the signal direction. FIG. 2 shows a triangular-waveform signal generated by means of an FPGA in integer increments as a function of FPGA clock cycles by way of example. The triangular-waveform signal can be generated from the step size and the signal direction by executing a program code, in particular a program code in the programming language C or a VHDL code. The processing unit 116 may be configured to execute the program code.

For example the program code may be designed to generate the triangular-waveform signal by means of an FPGA as follows:

```
n = step size*signal direction;                (1)
n0 = n0 + n;                                   (2)
n1 = amp*256;                                  (3)
n0 = lim(n0,n1);                               (4)
triangle = n0 >>8;                             (5)
n2 = lim_sts(triangle, amp);                   (6)
if (n2 !=0){                                   (7)
    SignalDirection = SignalDirection * (−1);  (8)
}                                              (9)
```

The signal direction is defined in lines (1) and (6) to (9). The function "lim_sts" in line 6 returns a 1 if the variable "triangle" is above the positive setpoint amplitude "amp", a −1 is returned if the variable "triangle" is below the negative setpoint amplitude and a 0 is returned if the value of the variable "triangle" is within the negative and positive setpoint amplitudes "amp". In the event of a positive setpoint amplitude being reached and in the event of a negative setpoint amplitude being reached, the signal direction can be reversed. Line (2) causes the step size to be added or subtracted on the basis of the variable "SignalDirection". The variable "step size" can be determined in a data pre-processing. Line (3) multiplies the setpoint amplitude by the factor of 256, which is consistent with a shift by 8 bits to the left. In line (4), the value of the variable "n0" is limited to the maximum setpoint amplitude, positive or negative, that was multiplied by a factor of 256 (variable "n1"). The triangular-waveform signal having the setpoint amplitude is generated in line (5). The triangular-waveform signal is generated from the variable "n0", which is divided by the factor of 256, this being consistent with a shift by 8 bits to the right. In the event of a shift by one bit to the right, a value can be divided by a factor of 2.

The signal generator 112 may furthermore be configured to generate at least one square-wave signal. The square-wave signal can in particular be generated simultaneously with the triangular-waveform signal. Additionally, the square-wave signal can be generated from the triangular-waveform signal. When the triangular-waveform signal counts upward the positive complete amplitude that was set can be output and when the triangular-waveform signal counts downward the negative complete amplitude can be output. The processing unit 116 may be configured to determine the calculated square-wave signal from the signal direction and the setpoint amplitude. To generate the square-wave signal, the processing unit 116 may be configured to execute a program code. The program code can in particular have further steps in addition to the program code described above in order to generate the square-wave signal. For example the square-wave signal can be determined by inserting a further line between lines (5) and (6):

```
square=SignalDirection*amp;
```

Figure 3:
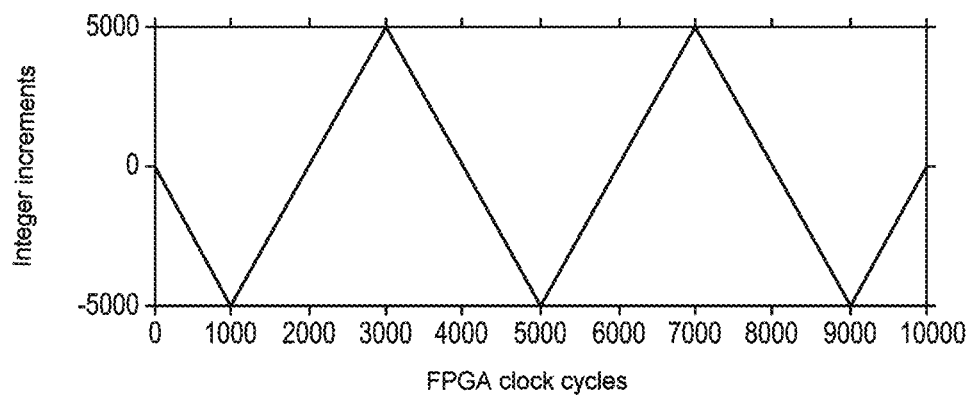
FIGS. 3A and 3B show a further example of a generated triangular-waveform signal and a square-wave signal generated therefrom.
Figure 3:
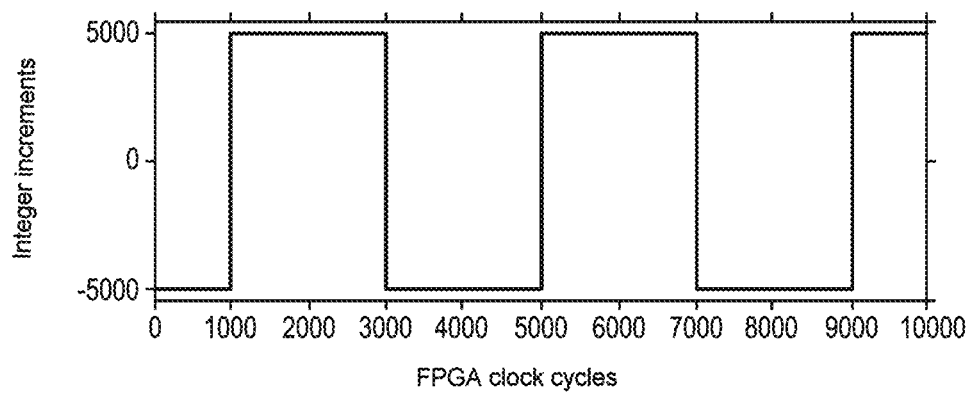

This additional line means that when the triangular-waveform signal counts in a positive direction the maximum positive amplitude can be stored and when the triangular-waveform signal counts in a negative direction the maximum negative desired amplitude can be stored in the variable "square". FIGS. 3A and 3B show the relationship between the generation of the triangular-waveform and square-wave signals and the timing trend of the signals. FIG. 3A shows the triangular-waveform signal in integer increments as a function of FPGA clock cycles and FIG. 3B shows the square-wave signal generated therefrom.

The signal generator 112 may furthermore be configured to generate at least one sine wave signal. The sine wave signal can in particular be generated simultaneously with the triangular-waveform signal. The calculation of a genuine sine wave signal can be very complex. Each individual value would in particular require a series expansion to be carried out. The signal generator 112 may be configured to approximate the sine wave signal by means of quadratic functions. The processing unit 116 may be configured to determine and generate the sine wave signal by squaring and scaling the triangular-waveform signal. To generate the sine wave signal, the processing unit 116 may be configured to execute a program code. The program code can in particular have further steps in addition to the program code described above in order to generate the sine wave signal. For example the sine wave signal can be determined and generated by inserting multiple further lines between lines (5) and (6):

```
sine_1 = triangle*triangle;
sine_2 = sine_1*SineWaveCoefficient;
sine_3 = sine_2 >>16;
sine_4 = amp − sine_3;
sine 5 = sine 4*SignalDirection;
```

Figure 4:
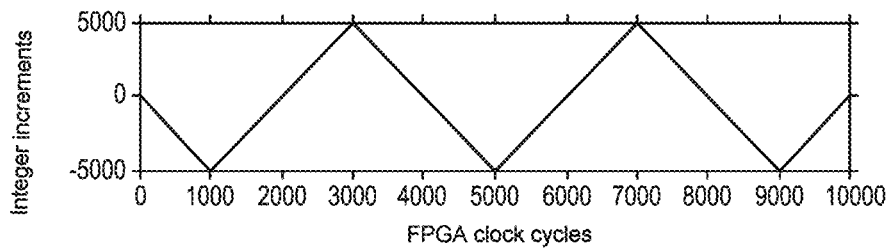
FIGS. 4A, 4B, 4C, and 4D show an example of generation of a sine wave signal.
Figure 4:
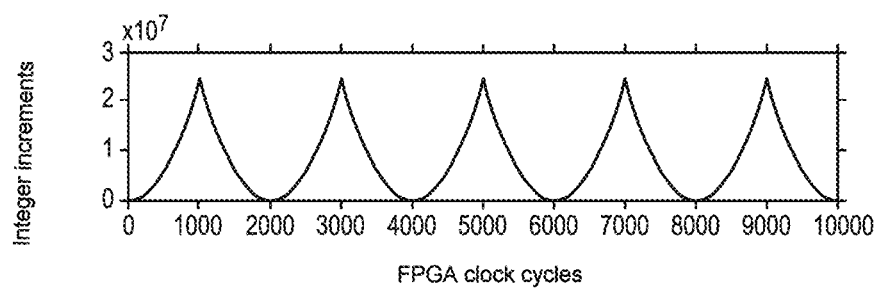
Figure 4:
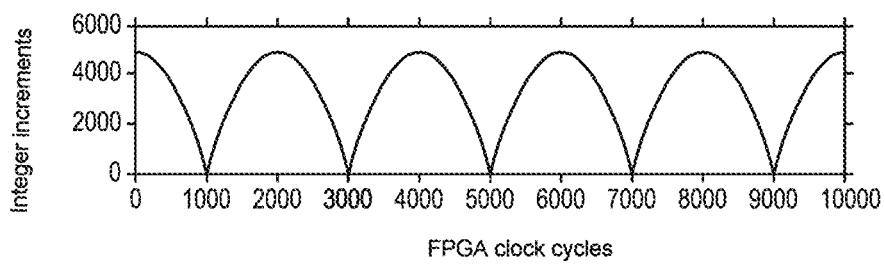
Figure 4:
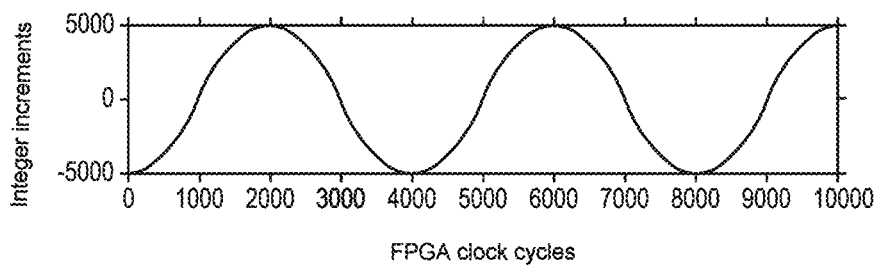

FIG. 4A shows an example generated triangular-waveform signal, from which a sine wave signal is generated. First, the triangular-waveform signal is squared according to this program code, which means that a signal having parabolas open at the top is produced, see FIG. 4B. Next, the signal is scaled by multiplying it by the variable "SineWaveCoefficient" and shifting it 16 bits to the right. The variable "SineWaveCoefficient" can be determined in a data preprocessing. The shape of the signal can remain unchanged. The sine wave coefficient can be determined for an FPGA by means of $$\text{sine wave coefficient} = \frac{65535}{amp},$$

where amp is the setpoint amplitude. The number 65535=256*256 allows for the squaring of the triangular-waveform signal. In the program code line for determining the variable "sine_4", the parabolas can be mirrored horizontally, see FIG. 4C. In the last line of the program code, the sine wave signal is generated with the setpoint amplitude and the setpoint frequency, see FIG. 4D.

The signal generator 112 according to the invention permits simultaneous generation and provision of three periodic output signals. This can be achieved by virtue of the individual signals being generated on the basis of one another. The program code can be executed in the processing unit 116, in particular inside the FPGA. The program code can also comprise just calculations that are not complex for an FPGA, such as multiplication, bit shifting, adding and logic functions, which means that the program code is resource-saving. Operations that are complex for an FPGA, such as divisions and calculation of numbers having decimal places, can be calculated on external computing units, which can perform these operations with much lower resource involvement. Furthermore, the signal generator 112 can reproduce a sine wave signal by means of quadratic functions, which means that a large amount of computing power can be saved. output signals is thus also possible using very small FPGAs, which are very much less expensive than large FPGAs.

The phrase at least one of A, B, and C should be construed to mean a logical (A OR B OR C), using a non-exclusive logical OR, and should not be construed to mean "at least one of A, at least one of B, and at least one of C."

LIST OF REFERENCE SIGNS

110 System
112 Signal generator
114 Interface
116 Processing unit
118 Computing unit
120 Communication interface
122 User computer
124 Computer environment

The invention claimed is:

1. A signal generator comprising:
a processing unit, wherein:
the signal generator is configured to generate at least one periodic output signal,
the periodic output signal comprises a triangular-waveform signal,
a frequency and an amplitude of the periodic output signal are adjustable,
the signal generator is configured to receive an input parameter,
the input parameter comprises at least one piece of information about a setpoint amplitude and a setpoint frequency of the periodic output signal,
the processing unit is configured to determine a signal direction of the periodic output signal,
the processing unit is configured to determine a step size,
the processing unit is configured to apply the step size to an actual amplitude based on the signal direction for a number of clock cycles, and
the number of clock cycles is dependent on the setpoint frequency of the periodic output signal.

2. The signal generator of claim 1, wherein the processing unit is configured to determine the triangular-waveform signal by:
a) determining a starting variable n0, wherein, depending on the signal direction, the determining comprises adding or subtracting the step size to or from a starting value, where n0=n0+(step size*signal direction), and wherein the step size is dependent on the setpoint amplitude and the setpoint frequency;
b) limiting the starting variable determined in a); and
c) storing the limited starting variable as the triangular-waveform signal.

3. The signal generator of claim 2, wherein the processing unit is configured to, in step b):
determine a scaled amplitude n1, with n1=amp*nscale, where amp is the setpoint amplitude and nscale is a scaling factor; and
limit the determined starting variable to the scaled amplitude.

4. The signal generator of claim 2, wherein the processing unit is configured to adapt the signal direction of the periodic output signal after step c).

5. The signal generator of claim 1, wherein the processing unit is configured to at least one of:
add the step size to the actual amplitude of the periodic output signal; and
subtract the step size from the actual amplitude based on the signal direction.

6. The signal generator of claim 1, wherein:
the signal generator is configured to generate at least one square-wave signal; and
the processing unit is configured to determine the square-wave signal from the signal direction and the setpoint amplitude.

7. The signal generator of claim 6, wherein the signal generator is configured to generate the square-wave signal simultaneously with the triangular-waveform signal.

8. The signal generator of claim 1, wherein:
the signal generator is configured to generate a sine wave signal; and
the processing unit is configured to determine and generate the sine wave signal by squaring and scaling the triangular-waveform signal.

9. The signal generator of claim 8, wherein the signal generator is configured to generate the sine wave signal simultaneously with the triangular-waveform signal.

10. The signal generator of claim 1, wherein the processing unit comprises at least one of a microcontroller, a field programmable gate array (FPGA), and a processor.

11. A system comprising:
the signal generator of claim 1; and
a computer environment comprising at least one of a microcontroller, an integrated circuit, and a processor of a computer.

12. The system of claim 11 wherein:
the computer environment comprises the integrated circuit; and
the integrated circuit is a field programmable gate array (FPGA).

13. A system comprising:
the signal generator of claim 1;
a computing unit; and
a communication interface,
wherein the at least one piece of information is inputtable into the communication interface, and
wherein the computing unit is configured to preprocess the at least one piece of information and to transmit the preprocessed information to the signal generator.

14. The system of claim 13, further comprising a further computing unit configured to perform data preprocessing.

15. A method for generating at least one periodic output signal by a signal generator, the periodic output signal including a triangular-waveform signal with a configurable frequency and amplitude, the method comprising:
   i) receiving an input parameter, wherein the input parameter comprises at least one piece of information about a setpoint amplitude and a setpoint frequency of the periodic output signal,
   ii) determining a signal direction of the periodic output signal using at least one processing unit; and
   iii) determining a step size by using the processing unit and applying the step size to an actual amplitude based on the signal direction for a number of clock cycles, wherein the number of clock cycles is dependent on the setpoint frequency of the periodic output signal.

16. The method of claim 15, further comprising determining the triangular-waveform signal by:
   iv) determining a starting variable n0 by, depending on the signal direction, adding or subtracting a step size to or from a starting value, where n0=n0+(step size*signal direction), wherein the step size is dependent on the setpoint amplitude and the setpoint frequency;
   v) limiting the starting variable determined in iv); and
   vi) storing the limited starting variable as the triangular-waveform signal.

17. The method of claim 15, further comprising generating at least one of a square-wave signal and a sine wave signal.

18. The method of claim 17, wherein the at least one of the square-wave signal and the sine wave signal is generated simultaneously with the triangular-waveform signal.

19. The method of claim 15, further comprising at least one preprocessing step, in which the at least one input parameter is provided.

\* \* \* \* \*